United States Patent
Marshall et al.

(10) Patent No.: US 6,547,423 B2
(45) Date of Patent: Apr. 15, 2003

(54) LED COLLIMATION OPTICS WITH IMPROVED PERFORMANCE AND REDUCED SIZE

(75) Inventors: Thomas Marshall, Hartsdale, NY (US); Michael Pashley, Cortlandt Manor, NY (US)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/747,483

(22) Filed: Dec. 22, 2000

(65) Prior Publication Data

US 2002/0080615 A1 Jun. 27, 2002

(51) Int. Cl.⁷ .................................................. F21V 5/00
(52) U.S. Cl. .................. 362/333; 362/326; 362/327; 362/328; 362/334; 362/335; 362/336; 362/350; 362/364; 362/255
(58) Field of Search .............................. 362/333, 326, 362/327, 328, 334, 335, 336, 555, 255, 500, 256

(56) References Cited

U.S. PATENT DOCUMENTS

| | | | | |
|---|---|---|---|---|
| 2,215,900 A | * | 9/1940 | Bitner | 359/718 |
| 4,642,740 A | | 2/1987 | True | 362/268 |
| 5,775,792 A | | 7/1998 | Wiese | 362/32 |
| 5,803,575 A | | 9/1998 | Ansems et al. | 362/32 |
| 5,813,743 A | * | 9/1998 | Naka | 362/16 |
| 6,019,493 A | * | 2/2000 | Kuo et al. | 116/63 R |

FOREIGN PATENT DOCUMENTS

| | | | | |
|---|---|---|---|---|
| DE | 19507234 A1 | * | 2/1995 | F21Q/1/00 |
| DE | 19507234 A | | 9/1996 | F21Q/1/00 |
| EP | 0596865 A2 | | 5/1994 | G01S/7/48 |
| GB | 2282700 A | | 4/1995 | F21V/7/00 |
| GB | 2295274 A | | 5/1996 | H01L/33/00 |
| WO | 9833007 A1 | | 7/1998 | F21S/1/10 |
| WO | 9901695 A1 | | 1/1999 | F21Q/1/00 |
| WO | WO0024062 | | 4/2000 | H01L/33/00 |

OTHER PUBLICATIONS

Patent Abstracts of Japan, Murata Hiroaki, "Light–Emitting Diode Structure," Publication No. 63033879, Feb. 13, 1988, Application No. 61177435, Jul. 28, 1986.
Patent Abstracts of Japan, Kawamura Tohsihide, "Light–Emitting Diode," Publication No. 61147585, May 7, 1989, Application No. 59270371, Dec. 21, 1984.

* cited by examiner

*Primary Examiner*—Sandra O'Shea
*Assistant Examiner*—Bertrand Zeade

(57) ABSTRACT

An LED module that includes an LED (light-emitting diode) and a rotationally symmetrical, bowl-shaped collimator lens is provided. The collimator lens has an inner refractive wall, an outer reflective wall, a first surface having an entrance aperture with a recess in which the LED is situated and which collimator lens is also provided with a second surface from which light generated by the LED emerges, the normal to the surface extending substantially parallel to the axis of symmetry of the lens, and the LED module also includes one or more of the following structures: (1) a conic wall portion of the recess of the inner refractive wall at the entrance aperture that includes a curved portion, and an outer reflective wall so configured in accordance with the structure of the inner refractive wall to achieve substantial collimation of a source of light at the entrance aperture; and/or (2) a first surface of the lens that is recessed away from the LED source; and/or (3) two surfaces of said refractive wall between which the refractive function of said refractive wall is divided. The LED module offers an improvement in the performance of the Flat top Tulip Collimator disclosed and claimed in our co-pending application Ser. No. 09/415,833 in terms of reduced size, beam divergence, beam uniformity, and to some degree efficiency. Moreover, it allows a wider variety of choices in optimizing various performance characteristics, and this in turn allows more flexibility in the structure design.

32 Claims, 4 Drawing Sheets

LED COLLIMATION OPTICS WITH IMPROVED PERFORMANCE AND REDUCED SIZE

FIELD OF THE INVENTION

The invention relates to an LED module comprising an LED (light-emitting diode) and a rotationally symmetrical, bowl-shaped collimator lens which is provided with a recess in which the LED is situated, and which collimator lens is also provided with a flat surface from which light generated by the LED emerges, the normal to the surface extending substantially parallel to the axis of symmetry of the lens. The invention also relates to a luminaire provided with a number of said LED modules.

BACKGROUND OF THE INVENTION

An LED module of the type mentioned in the opening paragraph is known per se. For example in the English-language abstract of Japanese patent application JP 61-147.585, a description is given of such an LED module. This LED module comprises an LED which is secured onto a substrate and which is positioned in the recess of a bowl-shaped collimator lens. This lens is rotationally symmetrical in shape and has an associated axis of symmetry. The position of the LED and the shape of the lens are attuned to each other in such a manner that a large part of the light generated by the LED is converted via refraction and reflection into a parallel light beam which leaves the lens via a flat surface. The lens and the substrate are secured in a metal housing.

This known LED module has an important drawback. The emerging light leaves the lens in a direction that is substantially parallel to the axis of symmetry of the lens. Under certain conditions it is desirable for the parallel beam to leave the lens at a certain angle, viewed relative to the axis of symmetry.

Copending application Ser. No. 09/415,833 filed Oct. 12, 1999 of Keuper and Pashley, the disclosure of which is incorporated herein by this reference thereto, aims at providing an LED module of the above-mentioned type, in which the light emerges at a specific angle relative to the axis of symmetry of the lens, the proposed LED module is additionally compact, the said LED module has a simple structure, and its manufacture is inexpensive. The LED module comprises a LED and a rotationally symmetrical, bowl-shaped collimator lens which is provided with a recess in which the LED is situated and which collimator lens is also provided with a flat surface from which light generated by the LED emerges, the normal to the surface extending substantially parallel to the axis of symmetry of the lens, which LED module in accordance with the invention is characterized in that the surface is provided with a sawtooth-like structure for deflecting the emerging light.

The invention in said co-pending application is based on the recognition that such a sawtooth-like structure offers a good solution to the deflection of the parallel beam leaving the lens. Since the maximum dimensions of the teeth are very small (below 1 mm), such a sawtooth-like structure can be provided in a relatively thin layer (thickness below 1 mm). By virtue thereof, also the maximum dimensions of the LED module remain limited. In comparison to alternative solutions in which a separate prism is arranged in front of the emergent face of the lens, or the lens is beveled, said co-pending application offers compact, inexpensive LED modules which can be readily manufactured. Such a collimator is referred to as the "flat top tulip" collimator. In its preferred embodiments, it is preferably a solid plastic piece with an air-filled indentation at the entrance aperture. The wall of the indentation is a section of a circular cone (of cone angle typically about 2°), and the indentation terminates in a lens shape. The LED (in an appropriate package) injects its light into the entrance aperture indentation, and that light follows one of two general paths. On one path it impinges on the inner (conic) wall of the solid collimator where it is refracted to the outer wall and subsequently reflected (typically by TIR) to the exit aperture. On the other path, it impinges on the refractive lens structure, and is then refracted towards the exit aperture. This is illustrated schematically in FIGS. 1A and 1B. The collimator is designed to produce perfectly collimated light from an ideal point source at the focus. When it is used with a real extended source of appreciable surface area (such as an LED chip), the collimation is incomplete (nor can it ever be complete for any design, for functional reasons). Instead it is directed into a diverging conic beam of cone angle $\theta$. Improving (i.e. reducing) this angle $\theta$ is a primary purpose of the present invention.

SUMMARY OF THE INVENTION

This invention represents an improvement in the performance of the Flat top Tulip Collimator disclosed and claimed in our co-pending application Ser. No. 09/415,833 referred to above in terms of reduced size, beam divergence, beam uniformity, and to some degree efficiency. Moreover, it allows a wider variety of choices in optimizing various performance characteristics at the expense of others. This in turn allows more flexibility in the design process, leading to improvements in the various applications that employ the LEDs and collimation optics.

According to the invention, the various optical surfaces of the collimation optics are defined according to one or more constructive rules in order to reduce the angular errors, which result from the finite (i.e. non-infinitesimal) LED source size.

The advantages of the present invention are described in the description that follows in terms of five main characteristics: (1) the beam divergence angle, (2) the exit aperture diameter $d_e$, (3) the overall height h, (4) the spatial uniformity of the exit beam, and (5) the efficiency $\eta$. Since $\theta$ and $d_e$ are ultimately related by a fundamental theorem—the conservation of etendue, the initial description is geared to one fixed value of $d_e$, namely 30 mm. This is arbitrary and for illustrative convenience only, and in no way limits the generality of possible design choices. In the discussion that follows, performance will be described in relation to a 30 mm flat top tulip collimator with a 1 mm square LED chip in the standard LED package with a 2.75 mm radius hemispheric dome lens. This will be referred to hereinafter as the "Reference Collimator 20" and is illustrated in FIG. 1A. Additionally, we take as the "beam divergence angle" the cone half-angle that envelopes 90% of the beam, and we refer to this angle hereinafter as angle $\theta_{90}\%$.

An object of this invention is to gain improvements in one or more desirable characteristics of a flat top tulip collimator without sacrificing performance in other areas. Such areas for improvement are discussed herein in terms of several distinct applications including high-performance white light illumination, Projection Displays, and Light Generators for signing and illumination.

For high performance white light illumination, especially involving the color mixing of red, green, and blue ("RGB"

LEDs), all of the above characteristics are important. In particular, for the deterministic color-mixing schemes such as the Beam Splitter Mixer as claimed in our U.S. Pat. No. 6,139,166 issued Oct. 31, 2000 and assigned to the same assignee as this application, or dichroic mixing, the sine qua non is the beam uniformity. This is the case because in these schemes, the various RGB beams are superposed, and if those beams are not uniform (e.g. if they contain imaging information) then that will result in unacceptable color error. Specifically, the lens of the Reference Collimator forms an image of the actual LED chip, which in addition to being generally square has bond-wire attachments, contact electrodes, and possibly other undesirable spatial non-uniformities- and thus directly leads to poor performance in such applications. Adding a diffusive surface property to the lens can disrupt the imaging, but in the Reference Collimator, this also increases $\theta_{90\%}$, which is undesirable.

Another object of the invention is to modify the flat top tulip collimator such that the beam divergence angle of the (smooth) lens portion is less than that of the reflector portion while keeping the reflector divergence low. This will permit using a diffusive surface on the lens to destroy the imaging, while keeping the total divergence low.

For applications such as Projection Video, the absolute quantity of light that can be gotten into a fixed-etendue target is a very important parameter, but also the light must be uniform. Such systems typically require some sort of spatial homogenization optics (i.e. an "integrator"), but it is still desirable that the initial beam be of good uniformity. In many (but by no means all) applications, there is a big premium on keeping the optical path as compact as possible.

It is therefore another object of the invention to provide a means for prioritizing and optimizing among these and other important parameters such that a Projection Video application can achieve one or more performance advantages over such a reference Collimator.

For applications such as Light Generators for signage or for illumination, the requirements are similar to those for Projection Video, except that the beam uniformity is less critical, because the fiber or light pipe that receives the light will substantially homogenize the beam. Thus optimal collimation and total light throughput can be stressed at the expense of uniformity (imaging) problems. Facilitating this specific optimization is yet another object of this invention.

These and other objects of the invention are achieved by a LED module comprising a LED and a rotationally symmetrical, bowl-shaped collimator lens which comprises an inner refractive wall, an outer reflective wall, a first surface having an entrance aperture with a recess in which the LED is situated and which collimator lens is also provided with a second surface (which may be planar or curved) from which light generated by the LED emerges, and, optionally, wherein the normal to the surface extends substantially parallel to the axis of symmetry of the lens, which LED module in accordance with the invention is characterized in having one or more of the following characteristics:

(1) a conic wall portion of the recess of the inner refractive wall at the entrance aperture is modified to include a curved portion, and the outer reflective wall is reconfigured in accordance with said modification of said inner refractive wall to achieve substantial collimation of a source of light at the entrance aperture; and/or (2) the first surface of the lens is recessed away from the LED source; and/or (3) the refractive function of said refractive wall (the lens) is divided between two curved surfaces of said lens.

In a preferred embodiment of the invention, the modification of the conic wall portion of the recess of the inner refractive wall at the entrance aperture to include a curved portion is achieved in a structure wherein a portion of the inner refractive wall is at a first angle from the optic axis that is larger than is a second angle from the optic axis of the comparable portion of the refractive wall in a Reference Collimator. For example, the distance $d_2$ from the center of the LED chip to the inner refractive wall at an angle of 45° to the optic axis (z axis) is greater for the preferred embodiment of FIG. 2 than the comparable distance $d_1$ in a Reference Collimator. This reduces the beam divergence due to the extended (i.e., non-infinitesimal) size of the LED chip.

In another preferred embodiment of the invention, the modification of the conic wall portion of the recess of the inner refractive wall at the entrance aperture to include a curved portion is achieved in a structure wherein the slope angle of the tangent to the portion of the inner refractive wall at an angle of 90° to the optic axis is a distance $d_3$ that is farther away from the vertical than is the distance $d_4$ in the comparable portion of the refractive wall in a Reference Collimator. This increases the steepness of the initial refraction (i.e., for rays at 90° to the optic axis), and therefore the steepness of the curve of the outer reflective wall. This-in turn allows for a more compact (and therefore more etendue-efficient) design.

In an especially preferred embodiment of the invention, the surface of the inner refractive wall is specified using a Constant Magnification Prescription whereby the refractive wall and the reflective wall are such that equal intervals of the polar-angle direction cosine in the input beam are mapped onto equal intervals of radial distance from the axis in the output beam. The surfaces are defined point-by-point and the inner wall surface tapers inward towards the optic axis as the polar angle decreases, may inflect and flair away from the optic axis.

In another embodiment of the invention, the modification of the conic wall portion of the recess of the inner refractive wall at the entrance aperture to include a curved portion is achieved in a structure so configured that the average angle of incidence on the inner refractive wall surface has a value close to normal incidence.

In another embodiment of the invention, the first surface of the lens is recessed away from the LED source in a structure wherein a starting point of the lens surface is shifted along a line from the focus point so that an edge ray from the LED source has a direct line-of-sight to the lens surface.

In another embodiment of the invention, the lens is divided between a first surface and a second surface in which the first surface is that portion of a bounding surface of the recess that lies within a cone of a cone angle lens 0 about the optic axis with vertex at the LED center. The second surface may be a planar top surface, or a curved top surface.

The lens may also comprise a diffusing element on or within the lens (using techniques to provide the diffusing element that are well known in the art) to improve uniformity.

For the flat-top variants of the present inventions, the LED module may comprise a sawtooth-like structure provided in a separate foil, which is secured to the second surface of the collimator lens. Additionally, the sawtooth structure when present may be pressed into the surface of the lens or such a surface may be obtained via a replica technique as disclosed in said copending application referred to above. In this technique, a solution of thermally curable or UV-curable material is provided on the flat surface of the known lens.

Subsequently, a template whose active surface is provided with the negative of the intended sawtooth-like structure is pressed into this liquid, after which the liquid is cured by exposure to heat or to UV radiation. Subsequently, the template is removed. This method also enables the entire lens in certain embodiments of the invention to be manufactured in a single step. It has been found that particularly (methyl) methacrylate compounds are very suitable for manufacturing the intended collimator lenses.

The invention also relates to a luminaire comprising a box-like housing which accommodates a number of LED modules, each module including a LED and a collimator lens having a structure according to this invention.

In principle, it is possible to use collimator lenses of moldable glass. In practice, however, it is more convenient to provide collimator lenses of a thermoplastic synthetic resin by injection molding. Very good results are achieved using lenses of polycarbonate, (methyl) methacrylate compounds, and the like for manufacturing the intended collimator lenses.

BRIEF DESCRIPTION OF THE DRAWINGS

It is noted that in the Figures like reference numerals refer to like parts. The drawings are not to scale.

DETAILED DESCRIPTION OF PREFERRED EMBODIMENTS

Figure 1A:
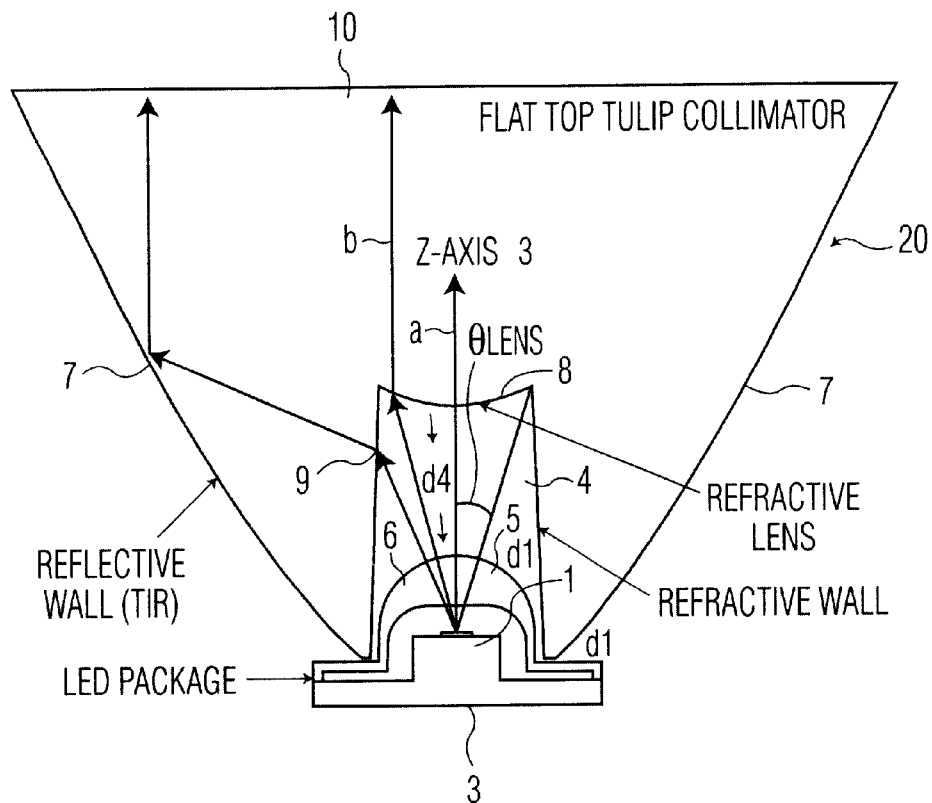
FIG. 1A is a diagrammatic, sectional view of an embodiment of a known LED module.
Figure 1B:
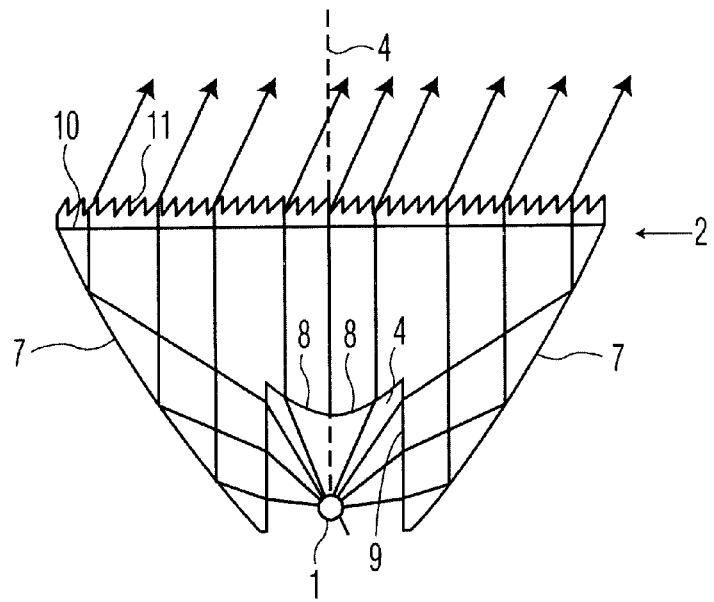
FIG. 1B is a diagrammatic, sectional view of a flat top tulip collimator as with a saw-tooth-like structure for deflecting the emerging light.

With reference to FIGS. 1A and 1B, which illustrates the prior art and a collimating element as described in co-pending application Ser. No. 09/415,833 filed Oct. 12, 1999 referred to above, respectively, an LED light source or module 1 is associated with an embodiment of a collimating element 2. The LED 1 is positioned in a recess 4 of the bowl-shaped collimating element 2. The collimating element 2 has an optical axis 3 and comprises a body 4 for emitting light during operation. In the example of FIG. 1A, the body 5 of the LED 1 is provided with a light-transmitting envelope 6, for example in the form of a lens. In the example of FIG. 1B, the LED is represented by a dot. The collimating element 2 has an optical axis 3, which coincides with the optical axis 3 of the LED 1. The shape of the collimating element 2 is chosen to be such that light originating from the LED 1 is emitted by the optical system in a direction parallel to the optical axis 3 of the collimating element 2. The shape of the curved outer walls 7 of the collimating element 2 approximates to a certain degree the shape of the outside surface of the body of revolution of a parabola. The LED 1 is positioned in the focus of this approximate parabola. The design is such that light rays emitted from the LED (and transmitted through the hemispheric dome lens of the LED package) at an angle less than or equal to θ lens (with respect to the optic axis) impinge on and are refracted by the first lens surface 8 and are then transmitted through the flat top 10, thus forming a portion of the output beam). Additionally, the design is such that light rays emitted from the LED (and transmitted through the hemispheric dome lens of the LED package) at an angle less than or equal to θ lens (with respect to the optic axis) impinge on and are refracted by the lens surface 9 and are then reflected by the surface 7 and transmitted through the flat top 10, thus forming a portion of the output beam. The surfaces 9,10 are predominantly cylindrical and flat, respectively. FIGS. 1A and 1B also diagrammatically show by means of arrows the optical path of a substantial part of the light generated by the LED 1. This is converted by the collimating element 2 into a parallel beam, either via deflection at the lens surface 8 or via deflection at the surface 9 and total reflection at the lens surface 7. Surface 8 of the collimating element 1 is curved such that light originating from the LED 1 and impinging on the surface 8 forms a parallel light beam after passing the surface 8, which light beam extends parallel to the optical axis 3 of the collimating element 2 (refraction). In addition, surfaces 7 are curved such that light originating from the LED 1 and impinging on the surface 7 is fully reflected in the direction of the surface 10 (and the sawtooth-like structure 11 of FIG. 1B), forms a parallel light beam extending parallel to the optical axis 3 of the collimating element 2.

The modified designs of this invention have the same basic structures as the Flat Top Tulip illustrated in FIG. 1. There are, however, two key augmentations that result in substantially different shapes and performance: (1) augmentations to the inner refractive wall and (2) augmentations to the lens. Either or both of these augmentations may be employed in any one specific design, and each augmentation may be done according to a variety of different prescriptions, depending upon the desired results.

In general, the augmentations are realized by a structure that includes one or more of the following:

(1) a conic wall portion of the recess 4 of the inner refractive wall 9 at the entrance aperture 3 is modified to include a curved portion 9', and the outer reflective wall 7 is reconfigured in accordance with said modification of said inner refractive wall 9 to achieve substantial collimation of a source of light 1 at the entrance aperture; and/or (2) the first surface 8 of the lens 2 is recessed away from the LED source 1; and/or (3) the refractive function of the lens is divided between two surfaces of the refractive wall, the lens (i.e., the portion of the bounding surface of the recess 4 that lies within a cone of cone angle θ lens about the optic axis, with vertex at the LED center). This lens may have a single curved surface 8 and a planar top 10, or it may have two curved surfaces (each of larger radius of curvature), one still depicted by 8 and the other by curved portion 11 of the top surface 10 (See FIGS. 5 and 6).

Augmentations to the Inner Reflective Wall

We have found that the conic (i.e. straight-line in cross-section) wall of the indentation at the entrance aperture may be replaced by a more generally curved-wall design. When this is done, the curvature of the outer reflective wall must be re-calculated and reconfigured in order to achieve collimation. It should be understood that any change to the inner wall is automatically accompanied by a change in the outer wall such that an ideal point source at the focal point is perfectly collimated by the two surfaces. It is therefore sufficient to describe the inner wall shape. This augmentation allows improvements consistent with some general principles: (1) this augmentation allows the inner refractive wall to be on average much farther from the LED source 1 than in the Reference Collimator, which in turn reduces the angular error due to the finite source size and thus reduces the beam divergence; (2) by allowing the slope angle of the tangent to the wall to be much farther from vertical than in the Reference Collimator in the region close to the plane of the entrance aperture 3, the outer wall 7 initially slopes upward more steeply. Since the outer wall surface 7 is defined in a step-by-step manner, using the previously defined point to generate the next point, this initial slope contributes to a more compact design; and (3) there is freedom to keep the average angle of incidence on the inner wall surface closer to normal incidence, which in turn reduces Fresnel reflection and thus contributes to a higher efficiency.

Figure 2:
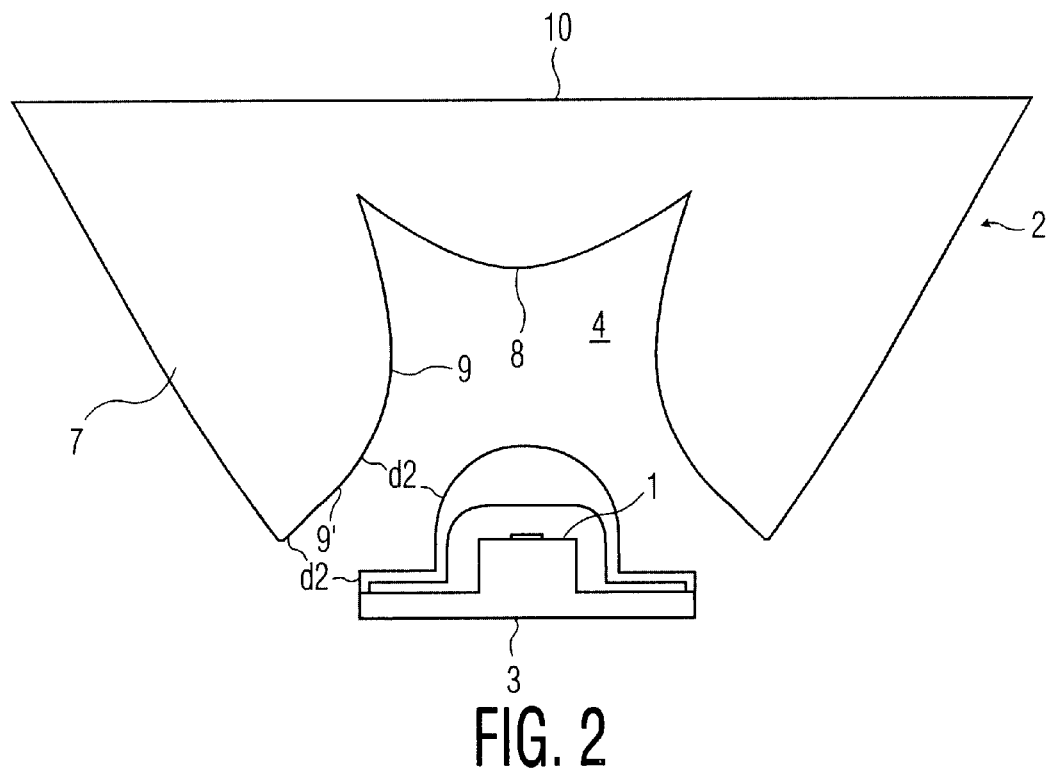
FIG. 2 is a diagrammatic, sectional view of a first embodiment of the LED module in accordance with the invention.

Although the surface of the inner wall 9 may be specified by a number of prescriptions, and the invention is intended to cover the most general case, two different prescriptions were investigated in detail, and demonstrated to produce improvements. The first embodiment uses a Constant Magnification prescription, which is in some respects similar to prescriptions of True, U.S. Pat. No. 4,642,740 and Shimizu, U.S. Pat. No. 5,966,250. In this embodiment, the refractive wall 9 and the reflective wall 7 are such that equal intervals of the polar-angle direction cosine in the input beam are mapped onto equal intervals of radial distance from the axis in the output beam. The surfaces are defined point-by-point starting at some maximum polar angle (typically 90° for the present designs) and proceeding up (towards the optic axis) to some minimum polar angle, which we denote as $\theta_{lens}$ (see FIG. 1). Finding designs with small values of $\theta_{lens}$ reduces the total flux through the (imaging) lens portion, and contributes to improved beam uniformity. It is a general feature of this design prescription that the inner wall surface 9, which initially tapers inward towards the optic axis 3 as the polar angle decreases, may inflect and flair away from the optic axis. This complicates the manufacture of the collimator 2, which in these cases must be injection-molded in two pieces, but it offers several optical advantages with respect to the lens position and prescription. This embodiment is illustrated in FIG. 2 wherein the modification of the conic wall portion of the recess 4 of the inner refractive wall 9 at the entrance aperture 3 to include a curved portion 9' is achieved in a structure wherein said portion 9' of the inner refractive wall 9 is configured to be farther away from the LED source than is the comparable portion 9' of the inner refractive wall 9 in a Reference Collimator 20 (FIG. 1A). For example, the inner reflective wall is a distance from the LED source $d_2$ that is greater than a distance from the LED source $d_1$ in a Reference Collimator 20, which reduces the beam divergence. It should be noted that in this embodiment, the overall height is less than that of the Reference Collimator 20, and the exit aperture 10 is still a flat surface, which is an advantage for some applications.

Figure 3:
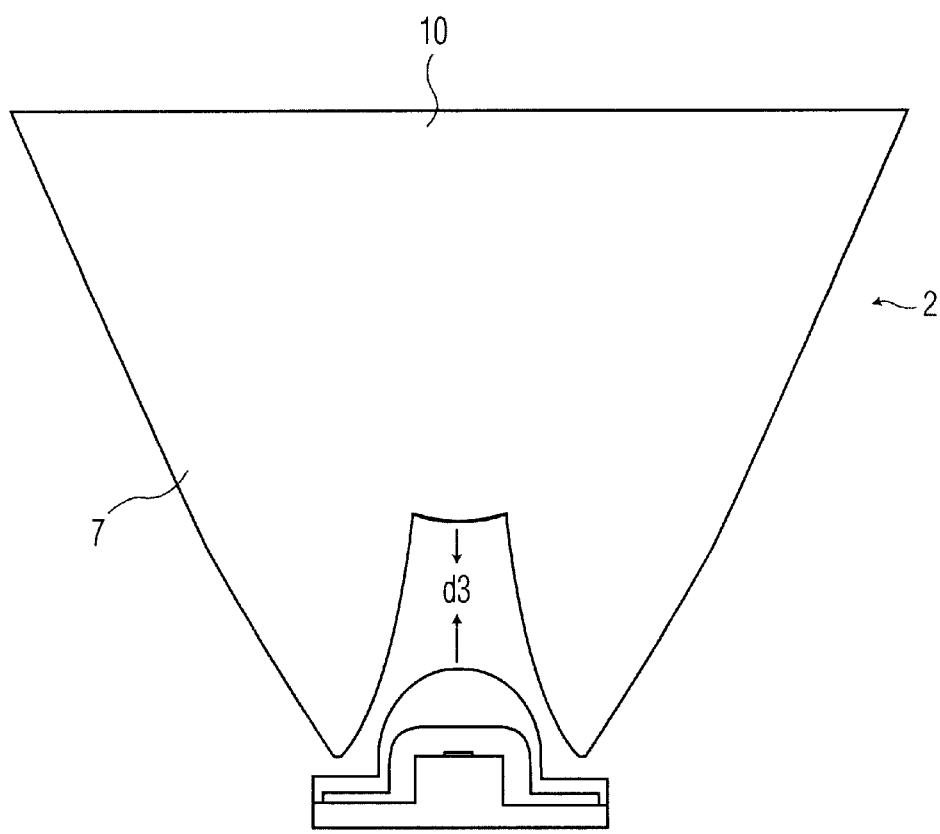
FIG. 3 is a diagrammatic, sectional view of a second embodiment of the LED module in accordance with the invention.

In another technique for determining the structure of the inner refractive wall, a functional form is selected to define the wall, and the required outer wall reflector shape is determined from the point-source criterion described above. This procedure has practical advantages and disadvantages. The advantages are full control over the wall shape, which in turn gives better control of efficiency (through control of the direction of the surface normal to minimize Fresnel losses). It also gives more precise control over the lens placement. It is therefore easier to design small-lens designs with this technique. The disadvantages are that the corresponding exit aperture is not known in advance, but rather must be found by calculating the outer reflector wall 7 by the procedure described above. Also, the degree of collimation is difficult to predict, and must be determined in a trial-and-error fashion. This is not a serious problem, but it can be a bit slower until experience is gained. An embodiment of the invention achieved by using a defining equation of the basic form $z=a/x+b$ is shown in FIG. 3. In this example, the inner refractive wall 9 of the recess 4 near the entrance aperture 3 has a curved portion 9' wherein the slope angle of the tangent to the said portion is inclined to the vertical at an angle substantially greater than is the comparable angle for the Reference Collimator 20. (See FIG. 2, at $d_2$). The tangent to the surface at this point is the line of the curve itself since there is very little curvature in this region, the tangent to a straight line being the line itself. The angle in question may be denoted by drawing a small vertical line upward through this point and indicating the angle (counterclockwise) between the vertical line and the curve. In the Reference Collimator, that angle is 2°. In the embodiment of the invention just described, it is about 45°.

Augmentations to the Lens

The lens subtends the polar angle $\theta_{lens}$, which is determined by the endpoint of the inside wall described above. According to the Reference Collimator 20, the lens is defined point-by-point from this starting point such that the point-source rays a,b are directed parallel to the optic axis 3 (so that they exit the planar exit aperture 10 without further refraction). This prescription may be used, and is illustrated in FIGS. 2 and 3, but the present invention describes several additional possible augmentations that allow improved performance. As discussed above, there are two types of augmentations, which may be used separately or in combination to achieve the desired performance: (1) the first surface 8 of the lens may be recessed away from the LED source 1, and (2) the refractive function of the lens may be split over two surfaces. The latter option prevents the desirable "flat top" feature (at least for the lens component), but it improves collimation performance.

Figure 4:
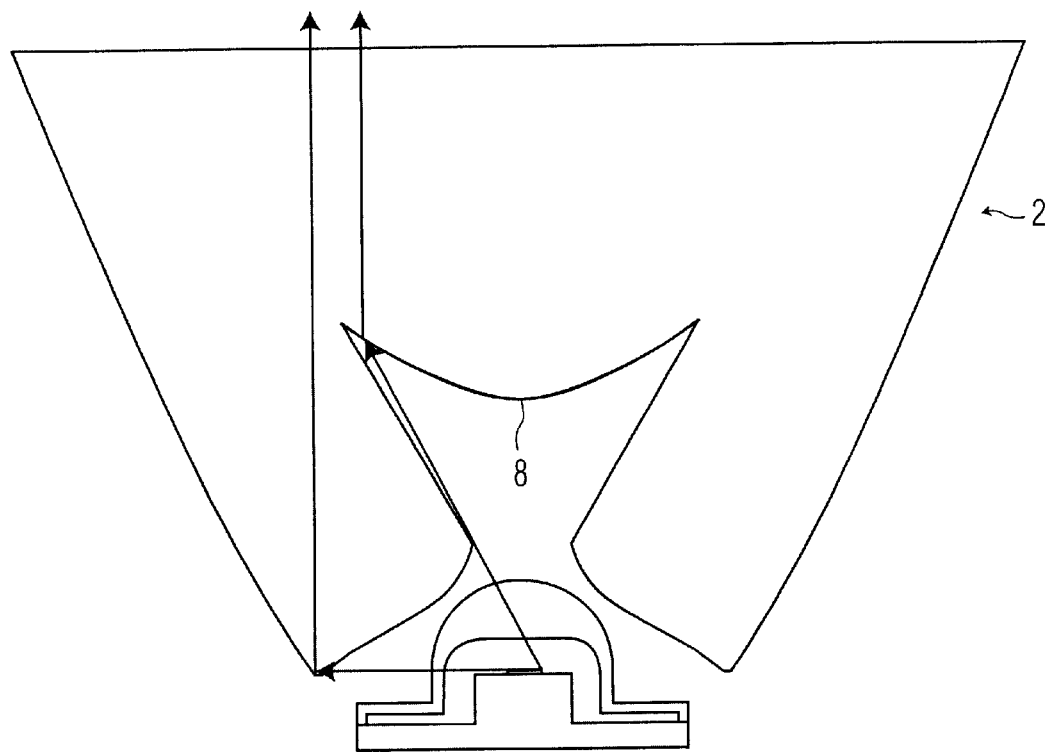
FIG. 4 is a diagrammatic, sectional view of a third embodiment of the LED module in accordance with the invention.

To implement the recessed-lens design, the starting point of the lens surface is shifted away from the source, and also radially outward (away from the optic axis). The initial point is shifted along a line from the focal point chosen so that an extreme edge ray from the extended source has a direct line-of-sight to the lens surface, such that the lens does not interfere with any reflected rays. The lens is then defined according to the standard prescription to perfectly collimate light from the focus. The situation is illustrated in FIG. 4. The recessed-lens feature is actually facilitated by embodiments of reflector designs with large entrance apertures, as this allows a greater degree of recess without shadowing the reflected rays.

Figure 5:
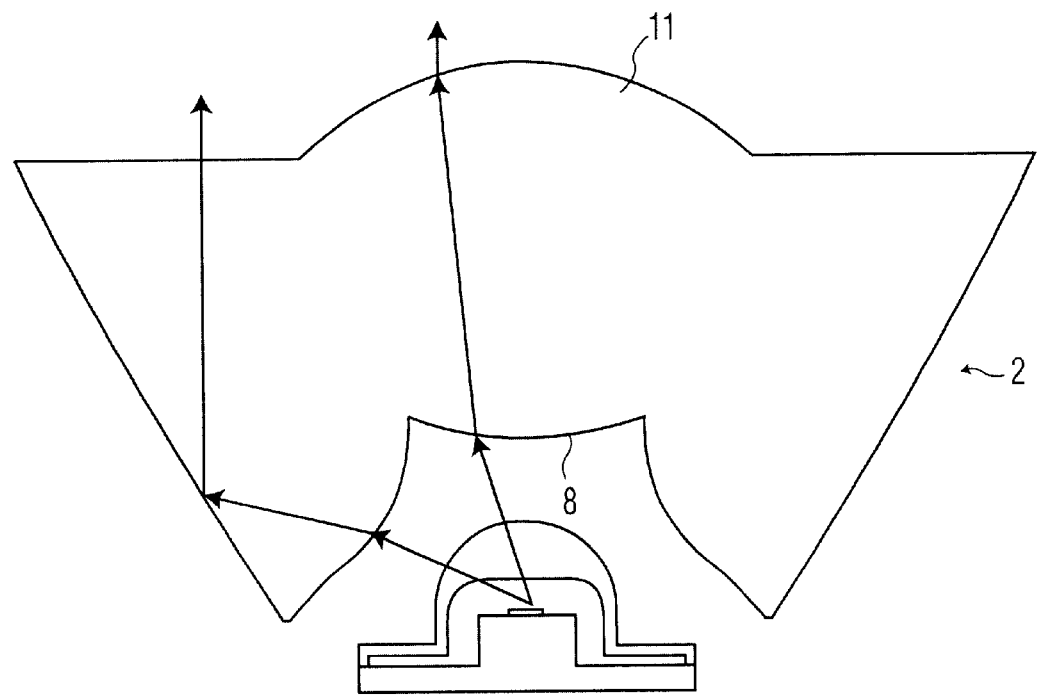
FIG. 5 is a diagrammatic, sectional view of a fourth embodiment of the LED module in accordance with the invention.

To implement the two-surface lens most effectively (for the case where there is no recess of the first surface), the starting point for the second surface is chosen using considerations similar to the recessed-first-surface lens described above, i.e. the starting point second surface should be moved upward and outward as far as possible. This results in the gentlest curvature of the first surface, which in turn leads to improved collimation (due to smaller angular error for a given linear displacement). An example of an embodiment of the invention using this principle is illustrated in FIG. 5. It should be noted that, as was the case for the recessed lens itself, this embodiment involves a relatively large entrance aperture 3, so that the second lens surface 10 may be chosen to be of fairly large diameter without shadowing the reflected rays.

The embodiment of FIG. 5 has many advantages, including that it can be injection molded as a single piece. (The embodiment of FIG. 4 cannot be easily molded as a single piece, because of the hollowed-out cavity formed by recessing the lens). However, since the lens portion subtends a fairly large cone angle ($\theta_{lens}=38°$), the design tends to image the LED chip rather strongly, resulting in a non-uniform beam profile.

Figure 6:
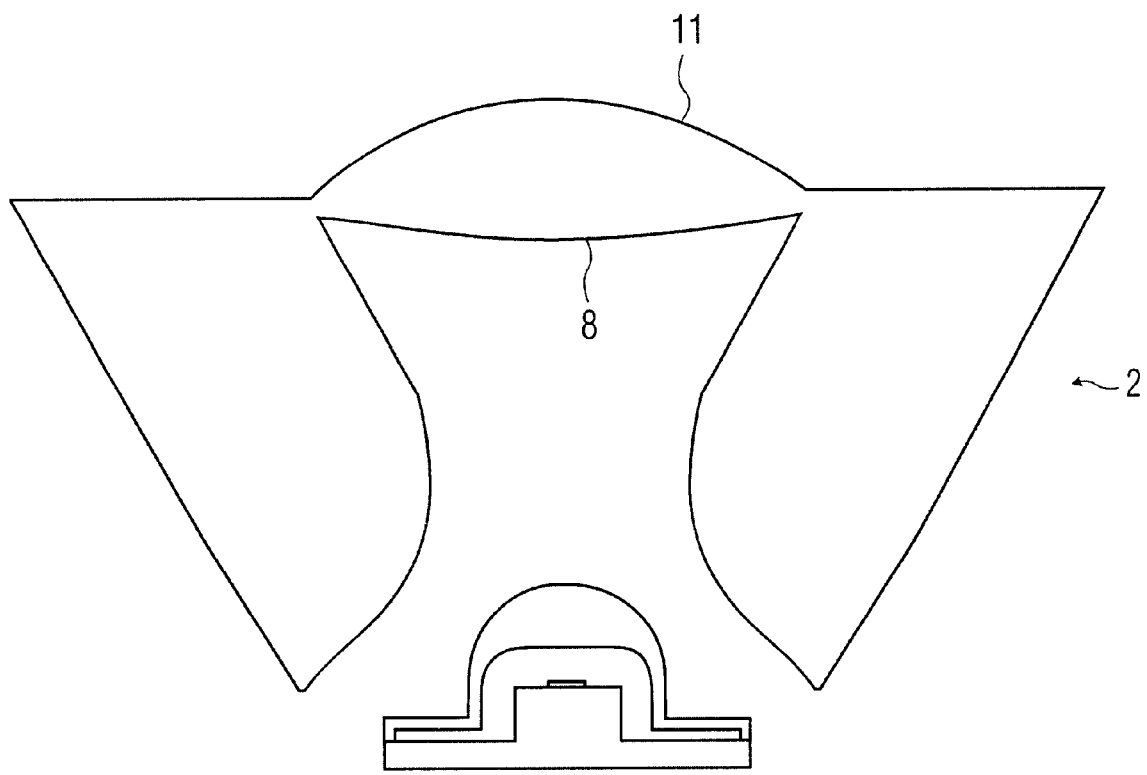
FIG. 6 is a diagrammatic, sectional view of a fifth embodiment of the LED module in accordance with the invention.

FIG. 6 is an example of a combination of several of the embodiments of the invention discussed and illustrated hereinabove. As an example of how to combine the various design elements presented above to achieve a specific goal, FIG. 6 illustrates a two-surface lens design with a recessed first surface 8. This design has several useful features. First, the lens subtends a smaller angle than the design of FIG. 5 ($\theta_{lens}=25.6°$). Even more importantly, because of the extreme recess of the first surface and the overall two-surface design, the lens portion collimates the reference LED chip rather more tightly than does the reflector portion (3.3° vs. 5.0° at 90% of total flux). Ordinarily, this lack of balance would be a design flaw, but for optimizing both collimation and beam profile uniformity, this embodiment is useful. To obtain the desired results, the lens surfaces is made slightly diffusive (e.g. by roughening the surface by bead-blasting), such that the (broadened) beam through the lens is of comparable divergence to the beam through the reflector portion. The net effect is that the diffusive element destroys the lens imaging, while the reflected beam is unaffected, and the overall beam is as narrow as is possible with a uniform profile.

The invention may be embodied in other specific forms without departing from the spirit and scope or essential characteristics thereof, the present disclosed examples being only preferred embodiments thereof.

We claim:

1. An LED module comprising an LED (light emitting diode) and a rotationally symmetrical, bowl-shaped collimator lens which comprises an inner refractive wall, an outer reflective wall, a first entrance surface having an entrance aperture at a recess in which the LED is situated, said first surface bounding a central portion of said recess, and a second surface from which light generated by the LED emerges, wherein the inner refractive wall includes a curved portion which is an additional entrance surface bounding said recess, and refracting light generated by the LED and impinging thereon, said recess being further bounded by a connecting surface extending between said first surface and said curved portion, arranged such that said connecting surface is free from impingement by light generated by the LED, said outer reflective wall being configured in accordance with the structure of said inner refractive wall to achieve substantial collimation of light generated by the LED.

2. An LED module as claimed in claim 1, wherein the lens is divided between a first surface and a second surface.

3. An LED module as claimed in claim 2, wherein said first surface is that portion of a bounding surface of the recess that lies within a cone of a cone angle lens θ about the optic axis with vertex at the LED center.

4. An LED module as claimed in claim 3, wherein the second surface is a planar top surface.

5. An LED module as claimed in claim 3, wherein the second surface is a curved top surface.

6. An LED module as claimed in claim 3, wherein the first surface and the second surface is a curved surface.

7. An LED module as claimed in claim 4, which comprises a diffusing element on or within the lens to improve uniformity.

8. An LED module as claimed in claim 1, wherein a portion of the inner refractive wall is at a first angle from the optic axis that is greater than is a second angle from the optic axis of a comparable portion of a refractive wall in a Reference Collimator.

9. An LED module as claimed in claim 4 wherein the distance from the center of the LED source to the inner refractive wall at a first angle from the optic axis is larger than is the distance from the center of the LED source to the inner refractive wall at a second angle from the optic axis of the comparable portion of the refractive wall in a Reference Collimator.

10. An LED module as claimed in claim 8, wherein a distance $d_2$ from the center of the LED chip to the inner refractive wall at an angle of 45° to the optic axis (z axis) is greater than the comparable distance $d_1$ in a Reference Collimator.

11. An LED module as claimed in claim 1, wherein the surface of the inner refractive wall is configured using a Constant Magnification Prescription whereby the refractive wall and the reflective wall are such that equal intervals of a polar-angle direction cosine in an input beam are mapped onto equal intervals of radial distance from the axis in an output beam.

12. An LED module as claimed in claim 11, wherein the inner and outer wall surfaces are defined point-by-point and wherein the inner wall surface tapers inward towards the optic axis as the polar-angle decreases.

13. An LED module as claimed in claim 12, wherein the inner wall surface also is inflected and flared away from the optic axis.

14. An LED module as claimed in claim 1, wherein said curved portion is achieved in a structure so configured that the average angle of incidence on the inner refractive wall surface has a value close to normal incidence.

15. An LED module as claimed in claim 1, wherein said first surface of the lens is recessed away from the LED source in a structure wherein a starting point of the lens surface is shifted along a line from the focus point so that an edge ray from the LED source has a direct line-of-sight to the lens surface.

16. An LED module as claimed in claim 1, which also includes a sawtooth-like structure provided in a separate foil, which is secured to the second surface of the collimator lens.

17. An LED module as claimed in claim 1, wherein the collimator lens is injection molded.

18. An LED module as claimed in claim 1, wherein the collimator lens is manufactured in a single step.

19. A luminaire comprising a box-like housing which accommodates one or a plurality of LED modules as defined in claim 1.

20. A luminaire comprising a box-like housing which accommodates one or a plurality of LED modules as defined in claim 2.

21. A luminaire comprising a box-like housing which accommodates one or a plurality of LED modules as defined in claim 3.

22. A luminaire comprising a box-like housing which accommodates one or a plurality of LED modules as defined in claim 4.

23. A luminaire comprising a box-like housing which accommodates one or a plurality of LED modules as defined in claim 3.

24. A luminaire comprising a box-like housing which accommodates one or a plurality of LED modules as defined in claim 6.

25. A luminaire comprising a box-like housing which accommodates one or a plurality of LED modules as defined in claim 7.

26. A luminaire comprising a box-like housing which accommodates one or a plurality of LED modules as defined in claim 8.

27. A luminaire comprising a box-like housing which accommodates one or a plurality of LED modules as defined in claim 9.

28. A luminaire comprising a box-like housing which accommodates one or a plurality of LED modules as defined in claim 14.

29. An LED module as claimed in claim 1 wherein said connecting surface is a conical surface.

30. An LED module comprising an LED (light emitting diode) and a rotationally symmetrical, bowl-shaped collimator lens which comprises an inner refractive wall, an outer reflective wall, a first surface having an entrance aperture at a recess in which the LED is situated, said first surface bounding a central portion of said recess, and a second surface from which light generated by the LED emerges, wherein the inner refractive wall includes a curved portion which is an additional entrance surface, said curved portion having a slope angle of a tangent to said curved portion at an angle of 90 degrees to the optic axis is farther away from the vertical than is a comparable portion of the refractive wall in a Reference Collimator, said outer reflective wall being configured in accordance with the structure of said inner refractive wall to achieve substantial collimation of a source of light at the entrance aperture.

31. An LED module comprising an LED (light emitting diode) and a rotationally symmetrical, bowl-shaped collimator lens which comprises an inner refractive wall, an outer reflective wall, a first surface having an entrance aperture at a recess in which the LED is situated, said first surface bounding a central portion of said recess, and a second surface from which light generated by the LED emerges, wherein the inner refractive wall includes a curved portion which is an additional entrance surface, said curved portion having a slope angle of a tangent to a part of said curved portion, at an angle of approximately 90 degrees to the optic axis at the entrance aperture, having a value such that an impinging ray of light from the LED is refracted toward the second surface, said outer reflective wall being configured in accordance with the structure of said inner refractive wall to achieve substantial collimation of a source of light at the entrance aperture.

32. An LED module as claimed in claim 31 wherein said second surface is a flat surface.

* * * * *

UNITED STATES PATENT AND TRADEMARK OFFICE
CERTIFICATE OF CORRECTION

PATENT NO.   : 6,547,423 B2
DATED        : April 15, 2003
INVENTOR(S)  : Thomas Marshal and Michael Pashley It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-third Day of September, 2003

JAMES E. ROGAN
*Director of the United States Patent and Trademark Office*